DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JANUARY 27, 1970

870 O.G. 1063

T870,021

LIGHT SENSITIVE CHALCONE POLYESTERS

Thomas Matthews Laakso, Kodak Park, Rochester, N.Y. 14650; Harold Lee Van Nice, 58A N. Fairway, Pullman, Wash. 99163; and Jack Leland Redavat Williams, Kodak Park, Rochester, N.Y. 14650

Filed Jan. 3, 1969, Ser. No. 788,943
Int. Cl. C08g *33/10*
U.S. Cl. 260—47
No Drawing. 21 Pages Specification

Light sensitive polymers are provided having repeating units of the formula:

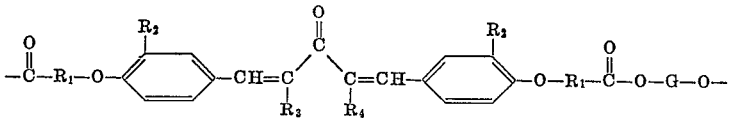

wherein $R_1$ is a lower alkylene radical of from 1 to 5 carbon atoms, preferably 1 to 2 carbon atoms, $R_2$ is hydrogen or lower alkoxy having from 1 to 5 carbon atoms, $R_3$ and $R_4$ are each hydrogen or lower alkyl of 1 to 5 carbon atoms or together constitute the atoms necessary to complete a carbocyclic ring of from 4 to 7 ring carbon atoms, which ring may be substituted for example, with lower alkyl groups of from 1–5 carbon atoms, and G is the divalent residue of a dihydric alcohol. The polyesters thus constitute the polyester reaction product of a dihydric alcohol with a bis chalcone acid having the formula:

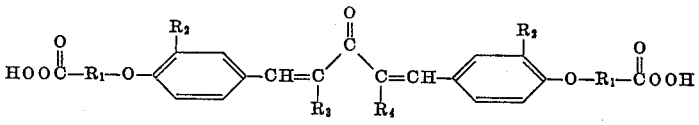

or with a bis chalcone ester having the formula:

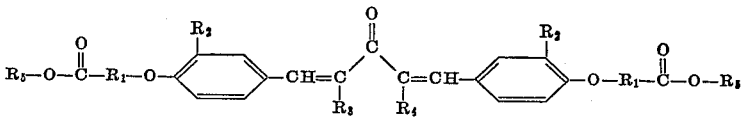

wherein $R_5$ is a lower alkyl radical of from 1 to 5 carbon atoms, preferably methyl or ethyl. The polyester is preferably obtained by an ester interchange reaction between the alcohol and the ester using conventional equipment and catalysts such as titanium isopropoxide, strontium oxide, magnesium-titanium esters, etc. The polyester may also be a copolyester, in which case at least 10 mole percent of the acid residues in the polyester are the bis chalcone residues.